United States Patent
Bogner et al.

(10) Patent No.: US 11,611,341 B2
(45) Date of Patent: Mar. 21, 2023

(54) SAMPLING CIRCUIT AND SAMPLING METHOD

(71) Applicant: Infineon Technologies AG, Neubiberg (DE)

(72) Inventors: Peter Bogner, Wernberg (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 17/341,941

(22) Filed: Jun. 8, 2021

(65) Prior Publication Data
US 2021/0297077 A1  Sep. 23, 2021

Related U.S. Application Data
(62) Division of application No. 16/708,876, filed on Dec. 10, 2019, now abandoned.

(30) Foreign Application Priority Data
Dec. 11, 2018  (DE) .......................... 102018131711.5

(51) Int. Cl.
*H03K 17/687* (2006.01)
*H03F 3/45* (2006.01)

(52) U.S. Cl.
CPC ....... *H03K 17/687* (2013.01); *H03F 3/45475* (2013.01); *H03F 2203/45544* (2013.01)

(58) Field of Classification Search
CPC .............. H03K 17/687; H03F 3/45475; H03F 2203/45544; H03F 2203/45551; H03F 2203/45586; H03F 2203/45588; H03M 1/1245
See application file for complete search history.

(56) References Cited

U.S. PATENT DOCUMENTS

| | | | |
|---|---|---|---|
| 7,786,767 B2 | 8/2010 | Kushner et al. | |
| 2006/0119412 A1* | 6/2006 | Wei | H03F 3/005 327/337 |
| 2011/0210763 A1* | 9/2011 | Kushner | H03M 1/1245 327/91 |
| 2013/0107632 A1 | 5/2013 | Van Tran et al. | |
| 2017/0331432 A1* | 11/2017 | Zhang | H03F 3/005 |
| 2020/0083901 A1* | 3/2020 | Adusumalli | H03M 1/1245 |

FOREIGN PATENT DOCUMENTS

DE  102006014925 B3  9/2007

* cited by examiner

*Primary Examiner* — Patrick C Chen
(74) *Attorney, Agent, or Firm* — Slater Matsil, LLP (57) ABSTRACT

Sampling circuits and methods for sampling are provided. In a first operating phase, sampling capacitors are coupled to inputs, and in a second operating phase, to a common-mode signal.

13 Claims, 4 Drawing Sheets

SAMPLING CIRCUIT AND SAMPLING METHOD

This application is a divisional of U.S. patent application Ser. No. 16/708,876, filed Dec. 10, 2019, which application claims the benefit of German Patent Application No. 102018131711.5, filed on Dec. 11, 2018, which applications are hereby incorporated herein by reference in its entirety.

TECHNICAL FIELD

The present application relates to sampling circuits and sampling methods.

BACKGROUND

Sampling circuits are used to sample an analog input signal at specified times, and may be part of an analog-to-digital converter (ADC), for example. One type of sampling circuit is based on switched capacitors. In this case, a sampling capacitor is connected in a first operating phase (sampling phase) to a signal input, and is connected in a second operating phase (redistribution phase) to a reference voltage, for instance ground.

In the case of differential sampling circuits, this circuit is usually duplicated, i.e. two capacitors are used.

In differential sampling circuits of this type, a differential quantity to be measured, for instance a differential voltage, may be far smaller than the absolute values of the sampled input quantities. For example, a sensing resistor can be used for a current measurement, with the voltage measured differentially across the resistor. The voltage drop across such a resistor may be several orders of magnitude smaller than the absolute voltage values that appear at the resistor. For example in automotive applications, voltages in the region of 40 V may arise in such cases, whereas a differential voltage across such a sensing resistor lies in the millivolt range.

SUMMARY

According to an exemplary embodiment, a sampling circuit includes a first input, which is configured to receive a first signal; a second input, which is configured to receive a second signal; a first sampling capacitor; a second sampling capacitor; a common-mode signal generating circuit, which is configured to generate a common-mode signal, which corresponds to a common-mode component of the first signal and of the second signal; and a switching circuit, which is configured to couple, in a first operating phase, a first terminal of the first sampling capacitor to the first input, and a first terminal of the second sampling capacitor to the second input, and to couple, in a second operating phase, the first terminal of the first sampling capacitor and the first terminal of the second sampling capacitor to the common-mode signal.

According to a further exemplary embodiment, a sampling method includes in a first operating phase, coupling a first terminal of a first capacitor to a first input signal, and a first terminal of a second capacitor to a second input signal; and in a second operating phase, coupling the first terminal of the first capacitor and the first terminal of the second capacitor to a common-mode signal, which corresponds to a common-mode component of the first signal and of the second signal.

The above summary merely provides a brief overview of some exemplary embodiments and is not intended to be limiting.

DETAILED DESCRIPTION OF ILLUSTRATIVE EMBODIMENTS

Various exemplary embodiments are explained in detail below. This explanation is purely illustrative and not intended to be limiting. It should be noted in particular that further exemplary embodiments may also have fewer features than the explicitly shown and described exemplary embodiments. Further features, for instance further components, in particular components used in conventional sampling circuits, may also be provided in addition to the explicitly described features.

Features of different exemplary embodiments can be combined with one another to form further exemplary embodiments. Modifications and variations described for one of the exemplary embodiments are also applicable to other exemplary embodiments unless explicitly stated otherwise.

Couplings or connections between components described below are electrical connections or couplings unless stated otherwise. Such connections or couplings may be direct or indirect (i.e., involving additional interposed elements) so long as the fundamental function of the connection or coupling, for instance transferring a signal such as a voltage signal or a current signal, is essentially maintained. In other words, connections or couplings can be modified provided this does not affect their function.

Figure 1:
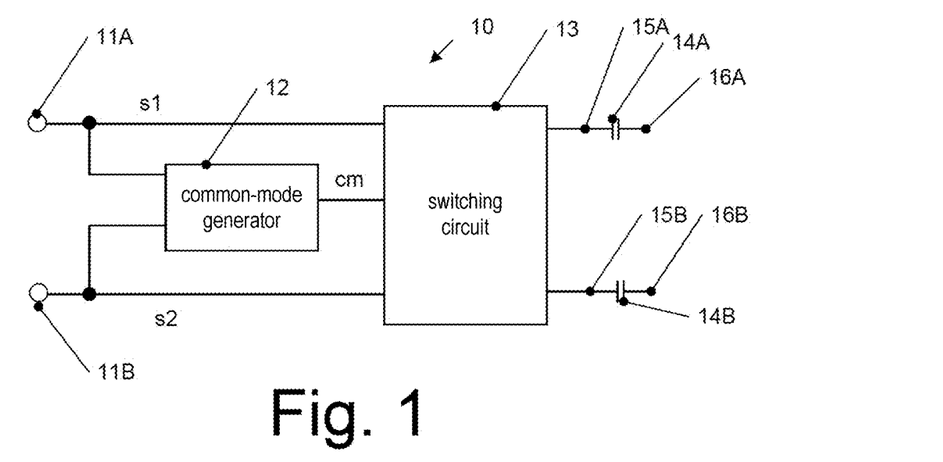
FIG. 1 is a block diagram of a sampling circuit according to an exemplary embodiment.

FIG. 1 shows a block diagram of a sampling circuit according to an exemplary embodiment. The sampling circuit of FIG. 1 comprises a first input 11A and a second input 11B. During operation, a first signal s1 is fed to the input 11A, and a second signal s2 is fed to the input 11B. The signals s1, 2s in particular may be voltage signals. In some exemplary embodiments, the signals s1, s2 together form a differential signal, i.e. the signal value represented by the differential signal equals a difference in values (for example voltage values) of the signals s1, s2.

In the sampling circuit 10 of FIG. 1, the signals s1, s2 are fed to a switching circuit 13. In addition, the signals s1, s2 are fed to a common-mode signal generating circuit 12. The common-mode signal generating circuit 12 generates from the signals s1, s2 a common-mode signal cm, which represents a common-mode component of the signals s1, s2. For example, the differential signal d, which is formed by the signals s1, s2, can be considered to be d=s1−s2, and the common-mode component cm to be cm=|(s1+s2)/2|. The signal s1 can then also be written as cm+d/2, and the signal s2 can also be written as cm−d/2. If the signals s1, s2 are voltage signals, cm is the corresponding common-mode voltage.

It should be noted that for other exemplary embodiments, one of the signals s1 and s2, for instance s1, may be the actual wanted signal, whereas the other signal, for instance s2, may be a corresponding reference potential.

A first input 15A of a first sampling capacitor 14A, and a first input 15B of a second sampling capacitor 14B are coupled to the switching circuit 13. In exemplary embodiments, the sampling capacitors 14A, 14B have the same capacitance values. They can, however, also have different capacitance values.

The switching circuit 13 is configured to operate the sampling circuit 10 in at least two operating phases. The term "operating phase" is used here generally to denote different operating phases of a sampling circuit. In a first operating phase, which corresponds to the sampling phase, the switching circuit 13 connects the input 11A to the first input 15A of the first capacitor 14A, and the input 11B to the first terminal 15B of the second capacitor 14B. The first sampling capacitor 14A is thereby charged to a voltage corresponding to the first signal s1, and the second sampling capacitor 14B is charged to a voltage corresponding to the second signal s2.

In a second operating phase, which corresponds to the redistribution phase, the switching circuit 13 decouples the terminals 15A, 15B from the inputs 11A and 11B respectively, and connects each of them to the common-mode signal cm. During operation, there are then further circuit components coupled to second terminals 16A, 16B of the capacitors 14A, 14B, which circuit components then process further the voltage signals lying at the capacitors 14A, 14B, with amplifier circuits or comparator circuits being examples of circuits for further processing of the sampled signals.

Within the meaning of the present application, a sampling circuit is therefore a circuit that is configured to sample one or more input signals. It may also comprise further circuit components for processing the sampled signals, so is not limited to containing just the circuit components needed for the sampling.

For some exemplary embodiments, using the common-mode signal cm in the second operating phase can avoid problems that might otherwise arise if the voltage difference s1−s2 is significantly smaller, e.g. at most 1/10 or at least 1/100, than the absolute value of the signals s1, s2. In conventional approaches, resultant voltage differences can cause problems for subsequent processing circuits such as amplifiers, or there is no fixed sampling time defined. In some exemplary embodiments, such processing circuits can be designed for lower maximum voltages than the switching circuit 13 and/or the common-mode signal generating circuit 12.

Further implementation options for sampling circuits are discussed below with reference to FIGS. 2-6. To avoid repetition, each discussion refers to the description of the preceding figures, and identical or corresponding elements carry the same reference signs and are not explained repeatedly in detail.

Figure 2:
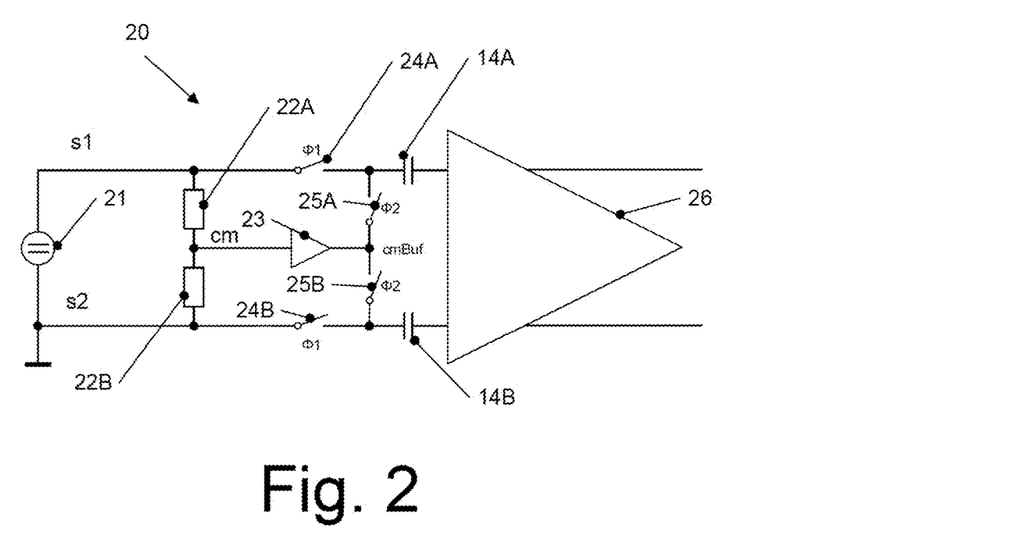
FIG. 2 is a circuit diagram of a sampling circuit according to a further exemplary embodiment.

FIG. 2 shows a sampling circuit 20 according to a further exemplary embodiment. A sensor 21, which generates differential signals s1, s2, is shown in FIG. 2 as an example of a source of signals to be sampled. In a simple example, the sensor 21 is a sensing resistor for measuring current, and the signals s1, s2 correspond to the voltages at the resistor. A difference in the signals s1−s2 then equals the voltage drop across the sensor 21, which is linked directly to the current flow through the sensor by the resistance of the sensor 21. This constitutes only a simple example, however, and other signal sources can also be used.

In the case of such sensing resistors, the resistance value is usually chosen to be as small as possible in order to reduce the power loss. This results in a correspondingly small voltage drop, which may lie in the millivolt range, for instance. The absolute values of the voltages of the signals s1 and s2 may be significantly higher, however, for example 10 V and above.

In the exemplary embodiment of FIG. 2, the signals s1, s2 are fed to a common-mode signal generating circuit for generating a common-mode signal cm. Said common-mode signal generating circuit in the exemplary embodiment of FIG. 2 comprises a resistive divider circuit comprising resistors 22A, 22B connected in series. The common-mode signal cm can be tapped at a node between the resistors 22A, 22B. In the exemplary embodiment of FIG. 2, this signal is additionally buffered by a buffer 23, with the result that the common-mode signal is output as a buffered signal cmBuf.

The resistors 22A and 22B have the same resistance values, within manufacturing tolerances, in the exemplary embodiment of FIG. 2. The resistors 22A, 22B may be selected to be relatively high impedance, for instance having resistance values of several 100 ohms, several kilohms or in the megaohm range, in order to reduce the current flow and thus the power loss. A high-impedance implementation of this type also places a relatively low load on the sensor 21, reducing distortion of the sensor signal, for instance. In the case of a current sensor as described above, for a high-impedance resistive divider, only a small part of the current flows through the resistive divider, so that the sensor 21 continues to measure substantially the entire current.

In addition, the sampling circuit 20 comprises a switching circuit comprising switches 24A, 24B, 25A, 25B. In a first operating phase, denoted in FIG. 2 by a control signal ϕ1, the switches 24A, 24B are in a closed state, and the switches 25A, 25B are open. Then in this phase, first terminals of the sampling capacitors 14A, 14B already discussed are connected to the sensor 21 in order to receive the signals s1, s2, with the result that the sampling capacitor 14A is charged according to the signal s1, and the second sampling capacitor 14B according to the signal s2. This phase corresponds to the actual sampling phase.

In a second operating phase, identified in FIG. 2 by a control signal ϕ2, the switches 24A, 24B are opened, and the switches 25A, 25B are closed. The first terminals of the sampling capacitors 14A, 14B are thereby connected to an output of the buffer 23 and hence to the common-mode signal cm. This phase corresponds to the redistribution phase. The designations ϕ0, ϕ1, ϕ2 etc. are used in this application both for the operating phases and for the corresponding drive signals for the switches during these operating phases.

It should be noted that for some exemplary embodiments, the resistive divider 22A, 22B can be in the off state during the first operating phase in order to reduce the power loss, because the common-mode signal cm only needs to be generated during the second operating phase in FIG. 2.

Second terminals of the sampling capacitors 14A, 14B are connected to further circuit components for processing the signals, in the case of FIG. 2 to a differential amplifier 26. Other types of circuits, for instance amplifiers having a single-pole output or comparators can also be used.

Using the common-mode signal cm in the second operating phase (redistribution phase) can lessen problems that may arise with conventional approaches in subsequent processing, for instance by means of the amplifier 26. As already explained with reference to FIG. 1, this applies in particular to cases in which a voltage difference between the signals s1, s2 is far smaller than the absolute value of the signals s1, s2, and in conventional approaches this can lead to problems during the subsequent processing, for instance as a result of ground fluctuations.

In the exemplary embodiment of FIG. 2, the common-mode signal cm is generated continuously, so to speak. In other exemplary embodiments, the common-mode signal cm can additionally be sampled. A corresponding exemplary embodiment is shown in FIG. 3.

Figure 3:
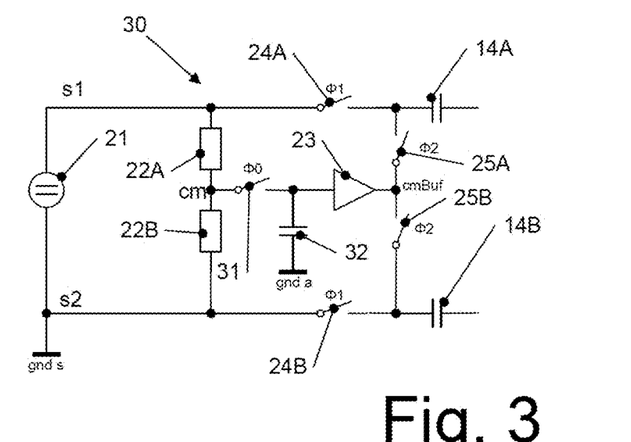
FIG. 3 is a circuit diagram of a sampling circuit according to a further exemplary embodiment.

The exemplary embodiment of FIG. 3 is based on the exemplary embodiment of FIG. 2, and identical elements carry the same reference signs. In addition to the components of FIG. 2, a switch 31 and a third sampling capacitor 32 are connected as shown between the resistive divider comprising the resistors 22A, 22B and the buffer 23. A ground potential to which the third sampling capacitor 32 is connected is denoted by "gnd a" to distinguish it from a ground potential, denoted by "gnd s" in FIG. 3, to which the sensor 21 is connected.

By closing the switch 31 in accordance with a control signal φ0, the third sampling capacitor 32 is charged according to the common-mode signal between the resistors 22A, 22B. The switch 31 is then reopened, and the common-mode signal, which has been charged, so to speak, onto the third sampling capacitor 32, is processed further by the buffer 23 in order to output the buffered common-mode signal cmBuf.

The switch 31 can be switched together with the switches 24A, 24B. In another implementation, the switches 24A, 24B are opened sequentially to the switch 31, which corresponds to sampling the signals s1, s2 at a time offset to the common-mode signal cm. For example in one implementation, the switches 24A, 24B can be opened first, and then the switch 31 can be opened in a further operating phase, in accordance with the control signal φ0, before the switches 25A, 25B are then closed.

This time-offset sampling can reduce cross-talk between the common-mode signal and the input signals in some implementations. Overall, using the third sampling capacitor 32 to sample the common-mode voltage can increase the robustness in some exemplary embodiments.

It should be noted that in exemplary embodiments, a time gap between sampling the common-mode signal and sampling in the first operating phase, i.e. sampling the input signals, is significantly smaller than a typical timescale at which the common-mode signal changes. This means that any time offset between sampling the common-mode signal and sampling the input signals is essentially negligible in terms of the accuracy of the common-mode signal.

Figure 4:
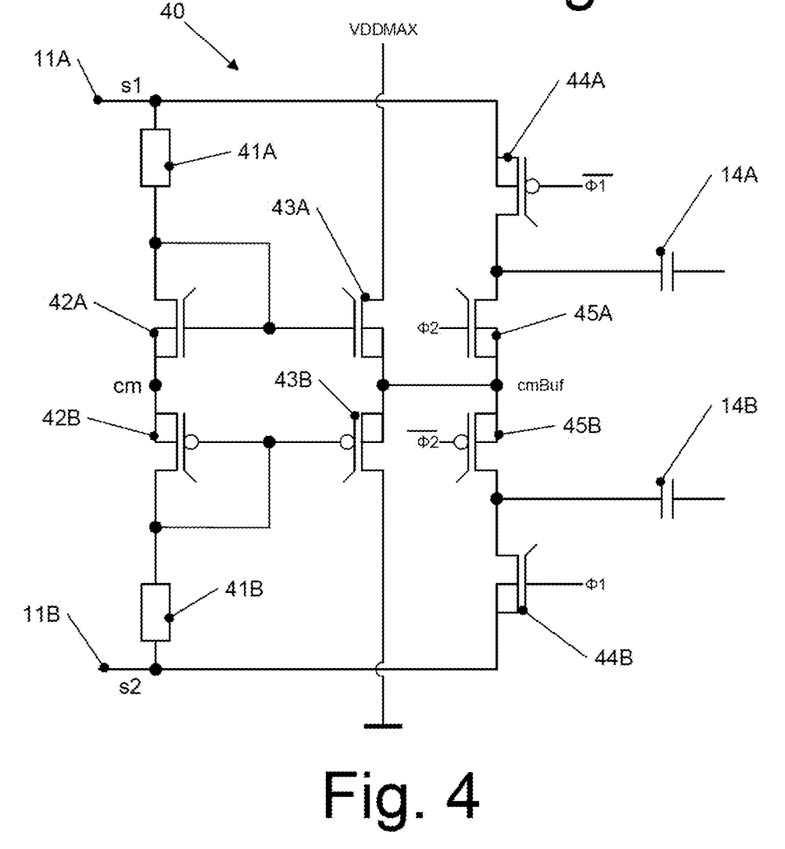
FIG. 4 is a circuit diagram of a sampling circuit according to a further exemplary embodiment.

FIG. 4 shows a sampling circuit 40 according to a further exemplary embodiment.

In the sampling circuit 40, switches such as the switches 24A, 24B, 25A, 25B of the previous exemplary embodiments are implemented as transistors. In addition, the buffer circuit 23 is also implemented using transistors. In the exemplary embodiment of FIG. 4, MOS (metal oxide semiconductor) field effect transistors are used. In other exemplary embodiments, other types of transistors can also be used, for instance bipolar transistors or IGBT transistors (isolated gate bipolar transistors). Transistors are described generically as having a control terminal and two load terminals. In the case of field effect transistors such as MOS transistors, the control terminal is the gate terminal, and the load terminals are the source and drain terminals. In the case of bipolar transistors, the control terminal is the base terminal, and the load terminals are the collector and emitter terminals. In the case of IGBTs, the control terminal is the gate terminal, and the load terminals are the collector and emitter terminals.

In order to generate a common-mode signal cm, the sampling circuit 40 of FIG. 4 again comprises a divider circuit. In the case of FIG. 4, this divider circuit is essentially a resistive divider circuit comprising resistors 41A, 41B, which are connected in series between the inputs 11A, 11B. In addition, the divider circuit also comprises a diode-connected NMOS transistor 42A and a diode-connected PMOS transistor 42B. The common-mode signal cm lies at a node between the transistors 42A, 42B.

A diode threshold of the diode-connected transistor 42A may lie above the common-mode signal cm, whereas a diode threshold of the transistor 42B may lie below the common-mode signal cm.

In the exemplary embodiment of FIG. 4, an NMOS transistor 43A and a PMOS transistor 43B connected as a complementary source-follower between a voltage VDD-MAX and ground are used as the buffer circuit. A gate terminal of the transistor 43A is connected to the gate terminal of the transistor 42A, and a gate terminal of the transistor 43B is connected to a gate terminal of the transistor 42B. The transistors 42A, 42B thus provide a control voltage for the transistors 43A, 43B, so that the buffered common-mode signal cmBuf lies at a node between the transistors 43A, 43B. In this case, the buffered common-mode signal cmBuf corresponds to the common-mode signal cm mirrored by the transistors 42A, 42B, 43A, 43B.

In addition, the exemplary embodiment of FIG. 4 comprises a PMOS transistor 44A and an NMOS transistor 44B, which essentially have the function of the switches 24A, 24B from the previous figures, and comprises an NMOS transistor 45A and a PMOS transistor 45B, which essentially have the function of the switches 25A, 25B of FIGS. 2 and 3. In the first operating phase already discussed, the switches 44A, 44B are closed by suitable control signals φ1 and $\overline{\varphi 1}$, where $\overline{\varphi 1}$ is the inverted signal of φ1, because the transistors are of opposite polarity. First terminals of the sampling capacitors 14A, 14B are thereby coupled to the inputs 11A and 11B respectively. In the second operating phase, the transistors 44A, 44B are then opened, and the transistors 45A, 45B are closed by suitable control signals φ2, $\overline{\varphi 2}$, in order to connect the first terminals of the sampling capacitors 14A, 14B to the buffered common-mode signal cmBuf.

Control signals for the transistors 44A, 44B, 45A, 45B can be generated in this case by means of a controller contained in the switching circuit 13. This controller can comprise an oscillator for generating a clock, and level converters for generating control signals at suitable signal levels.

Figure 5:
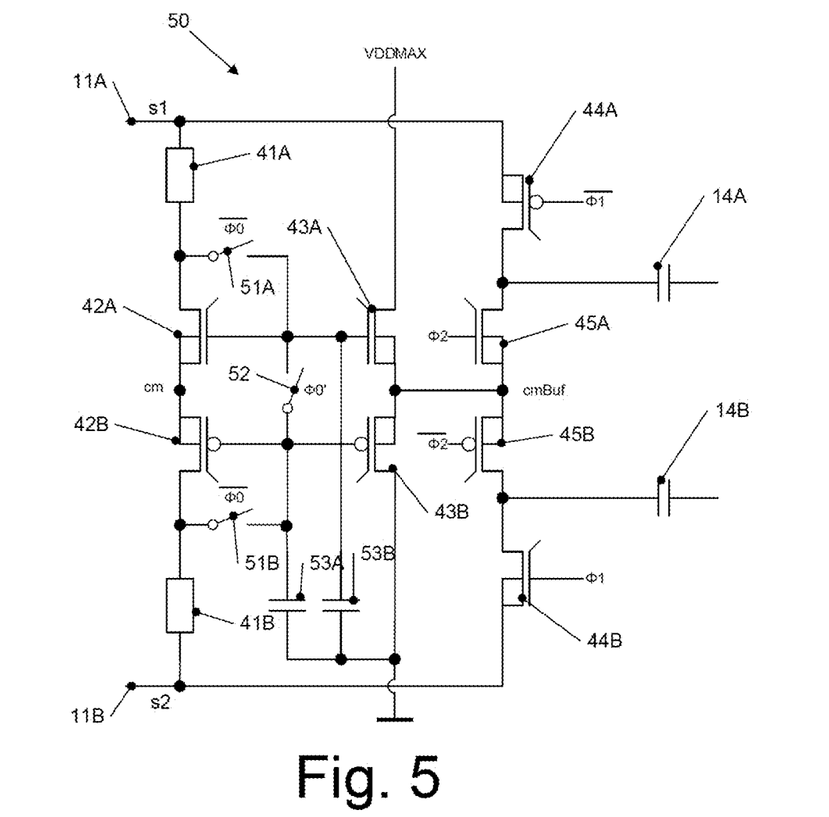
FIG. 5 is a circuit diagram of a sampling circuit according to a further exemplary embodiment.

When the sampling circuit is not needed or there is no need to generate the common-mode signal cm, in some exemplary embodiments, the divider circuit (in the case of FIG. 4 the divider circuits 41A, 41B, 42A, 42B) can be switched off to lower the power consumption. For example, once the common-mode signal cm has been sampled, the common-mode signal cm is not needed after opening the switch 31 of FIG. 3 until a next sampling. In addition, including in an exemplary embodiment such as the exemplary embodiment of FIG. 4, sampling of the common-mode signal can be facilitated. A corresponding exemplary embodiment is shown in FIG. 5. A sampling circuit 50 of FIG. 5 is based on the sampling circuit 40 of FIG. 4, and identical or corresponding elements carry the same reference signs and are not described again.

As an addition to the sampling circuit 40 of FIG. 4, the sampling circuit 50 of FIG. 5 comprises switches 51A, 51B. The switch 51A is coupled between gate and drain of the transistor 42A, and the switch 51B is coupled between gate and drain of the transistor 42B. In addition, a switch 52 is coupled between the gate terminals of the transistors 42A, 42B.

A third sampling capacitor 53A is coupled between the gate terminal of the transistor 42B and ground, and a fourth sampling capacitor 53B is coupled between the gate terminal of the transistor 42A and ground. If the switches 51A, 51B are closed, and the switch 52 is open, the sampling capacitors 53A, 53B are pre-charged to corresponding gate voltages, which then after the switches 51A, 51B are opened and the switch 52 is closed, drive the buffer circuit 43A, 43B suitably to output the buffered common-mode signal cmBuf. If the switches 51A, 51B are open and the switch 52 closed, in addition the divider circuit is disabled, and therefore no current can flow here. Said disabling of the divider circuit can also be provided independently of the sampling by means of the sampling capacitors 53A, 53B.

Figure 6:
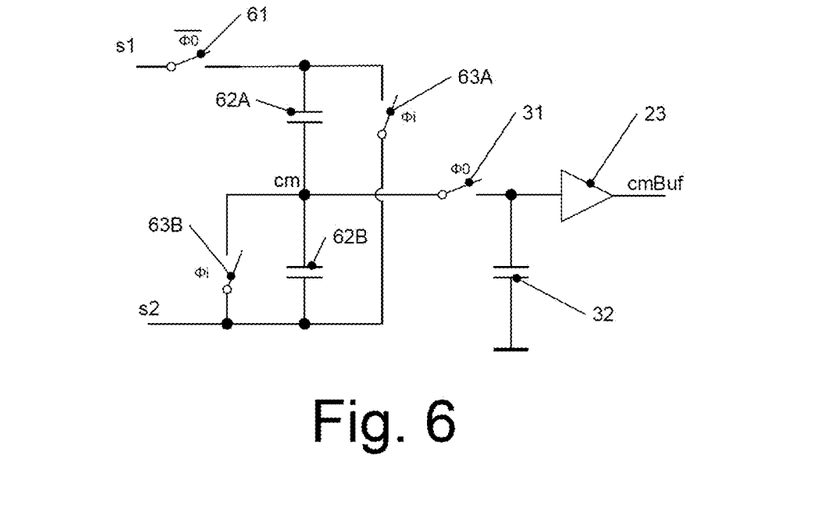
FIG. 6 is a circuit diagram of a common-mode signal generating circuit for use in various exemplary embodiments.

Resistive divider circuits are used in the exemplary embodiments discussed with reference to FIGS. 2-5. In other exemplary embodiments, it is also possible to use a capacitive divider circuit for generating the common-mode signal cm. FIG. 6 shows a common-mode signal generating circuit 60 according to such an exemplary embodiment. This common-mode signal generating circuit of FIG. 6 can replace the resistive divider circuit of FIG. 3, for example. It is also possible for the other exemplary embodiments shown in FIGS. 2, 4, and 5 to use corresponding capacitive divider circuits instead of resistive divider circuits.

FIG. 6 shows only the common-mode signal generating circuit 60 itself. Other components of a sampling circuit can be implemented as described with reference to FIGS. 1-5.

The common-mode signal generating circuit 60 of FIG. 6 comprises a capacitive divider, which comprises a first capacitor 62A and a second capacitor 62B, which are coupled in series between the signals s1 and s2 in order to generate the common-mode signal cm. In the exemplary embodiment of FIG. 6, the capacitors 62A, 62B have the same capacitance values, within manufacturing tolerances.

The capacitors 62A, 62B are connected to switches 63A, 63B, which are used for initializing the circuit of FIG. 6. The capacitors 62A, 62B are discharged when these switches 63A, 63B are closed in an additional initialization phase, identified by a control signal Oi. In other exemplary embodiments, initialization can also be performed by charging the capacitors 62A, 62B to a predetermined voltage.

In order to generate the common-mode signal cm, a switch 61 is then closed while the previously discussed switch 31 is open. This produces the common-mode signal cm at a node between the capacitors 62A, 62B. In order to sample this common-mode signal, the switch 61 is then opened, and the switch 31 closed, whereby the common-mode signal cm, as already discussed, serves to charge the third sampling capacitor 32. A downstream buffer 23 again generates the buffered common-mode signal cmBuf.

Figure 7:
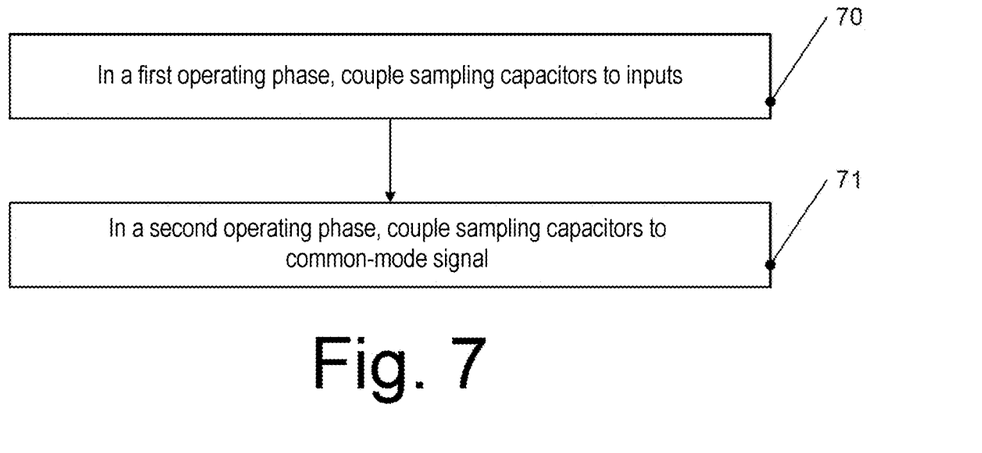
FIG. 7 is a flow diagram for illustrating methods according to various exemplary embodiments.

FIG. 7 shows a flow diagram for illustrating methods according to various exemplary embodiments.

The method of FIG. 7 can be implemented by the previously discussed sampling circuits of FIGS. 1-6, and is described with reference to these figures. Variations and modifications that were described for the sampling circuits are also correspondingly applicable to the method of FIG. 7.

In 70 of the method of FIG. 7, in a first operating phase, a first and a second sampling capacitor are coupled to corresponding signal inputs. For example, the sampling capacitors 14A, 14B are coupled to the corresponding inputs 11A, 11B.

In 71, in a second operating phase, the capacitors are coupled to a common-mode signal, which corresponds to a common-mode component of signals lying at the inputs, for instance corresponds to the common-mode component cm or the buffered common-mode component cmBuf.

In other respects, the explanations relating to the devices of FIGS. 1-6 apply correspondingly to the method of FIG. 7.

The following examples define some exemplary embodiments:

Example 1. A sampling circuit (10; 20; 30; 40; 50), comprising:
a first input (11A), which is configured to receive a first signal (s1);
a second input (11B), which is configured to receive a second signal (s2);
a first sampling capacitor (14A);
a second sampling capacitor (14B);
a common-mode signal generating circuit (12; 22A, 22B, 23; 31, 32; 41A, 41B, 42A, 42B, 43A, 43B, 45A, 45B; 51A; 51B; 52; 53A; 53B; 60, 61, 62A, 62B, 63A, 63B), which is configured to generate a common-mode signal (cm), which corresponds to a common-mode component of the first signal (s1) and of the second signal (s2); and
a switching circuit (13; 24A, 24B, 25A, 25B; 44A, 44B), which is configured to couple, in a first operating phase, a first terminal (15A) of the first sampling capacitor (14A) to the first input (11A), and a first terminal (15B) of the second sampling capacitor (14B) to the second input (11B), and in a second operating phase, to couple the first terminal of the first sampling capacitor (14A) and the first terminal of the second sampling capacitor (14B) to the common-mode signal (cm).

Example 2. The sampling circuit (10; 20; 30; 40; 50) according to Example 1, wherein the switching circuit (13; 24A, 24B, 25A, 25B; 44A, 44B) is configured to decouple the first terminal (15A) of the first sampling capacitor (14A) from the first input (11A), and to decouple the first terminal (15B) of the second sampling capacitor (14B) from the second input (11B), in the second operating phase.

Example 3. The sampling circuit (10; 20; 30; 40; 50) according to Example 1 or 2, wherein the common-mode signal generating circuit (12; 22A, 22B, 23; 31, 32; 41A, 41B, 42A, 42B, 43A, 43B, 45A, 45B; 51A; 51B; 52; 53A; 53B; 60, 61, 62A, 62B, 63A, 63B) is configured to sample the common-mode signal (cm) and to provide the sampled common-mode signal to the switching circuit (13; 24A, 24B, 25A, 25B; 44A, 44B).

Example 4. The sampling circuit (10; 20; 30; 40; 50) according to Example 3, wherein for the purpose of sampling the common-mode signal (cm), the common-mode signal generating circuit (12; 22A, 22B, 23; 31, 32; 41A, 41B, 42A, 42B, 43A, 43B, 45A, 45B; 51A; 51B; 52; 53A; 53B; 60, 61, 62A, 62B, 63A, 63B) comprises at least one third sampling capacitor (32; 53A, 53B).

Example 5. The sampling circuit (10; 20; 30; 40; 50) according to any of Examples 1 to 4, wherein the common-mode signal generating circuit (12; 22A, 22B, 23; 31, 32; 41A, 41B, 42A, 42B, 43A, 43B, 45A, 45B; 51A; 51B; 52; 53A; 53B; 60, 61, 62A, 62B, 63A, 63B) comprises a divider circuit (22A, 22B; 41A, 41B, 42A, 42B, 43A, 43B; 62A, 62B; 63A; 63B) coupled between the first input (11A) and the second input (11B).

Example 6. The sampling circuit (10; 20; 30; 40; 50) according to Example 5, wherein the common-mode signal generating circuit (12; 22A, 22B, 23; 31, 32; 41A, 41B, 42A, 42B, 43A, 43B; 45A, 45B; 51A; 51B; 52; 53A; 53B; 60, 61, 62A, 62B, 63A, 63B) comprises a buffer circuit (23; 43A, 43B) coupled to an output node of the divider circuit (22A, 22B; 41A, 41B, 42A, 42B, 43A, 43B; 62A, 62B; 63A; 63B).

Example 7. The sampling circuit (10; 20; 30; 40; 50) according to Example 5 or 6, wherein the divider circuit (22A, 22B; 41A, 41B, 42A, 42B, 43A, 43B) comprises a resistive divider circuit.

Example 8. The sampling circuit (50) according to Example 6, wherein the divider circuit (41A, 41B, 42A, 42B, 43A, 43B) comprises a series circuit composed of a first resistor (41A), a first diode-connected transistor (42A), a second diode-connected transistor (42B) and a second resistor (41B), which series circuit is coupled between the first input (11A) and the second input (11B).

Example 9. The sampling circuit (50) according to Example 8, wherein the divider circuit (41A, 41B, 42A, 42B, 43A, 43B) comprises a third transistor (43A) and a fourth transistor (43B), wherein a control terminal of the third transistor (43A) is connected to a control terminal of the first diode-connected transistor (42A), and wherein a control terminal of the fourth transistor (43B) is connected to a control terminal of the second diode-connected transistor (42B).

Example 10. The sampling circuit according to Example 5 or 6, wherein the divider circuit (62A, 62B; 63A, 63B) comprises a capacitive divider circuit.

Example 11. The sampling circuit according to Example 10, wherein the divider circuit (62A, 62B; 63A; 63B) comprises a series circuit composed of a first capacitor (62A) and a second capacitor (62B), which series circuit is coupled between the first input (11A) and the second input (11B), and an initialization circuit (63A, 63B) for initializing the first capacitor (62A) and the second capacitor (62B).

Example 12. The sampling circuit (10; 20; 30; 40; 50) according to any of Examples 1 to 11, further comprising a processing circuit (26), which is coupled to a second terminal of the first capacitor (14A) and to a second terminal of the second capacitor (14B), wherein the processing circuit is designed for a lower maximum voltage than the common-mode signal generating circuit (12; 22A, 22B, 23; 31, 32; 41A, 41B, 42A, 42B, 43A, 43B; 45A, 45B; 51A; 51B; 52; 53A; 53B; 60, 61, 62A, 62B, 63A, 63B) and/or the switching circuit (13; 24A, 24B, 25A, 25B; 44A, 44B).

Example 13. The sampling circuit (10; 20; 30; 40; 50) according to any of Examples 1-12, wherein the common-mode signal generating circuit (12; 22A, 22B, 23; 31, 32; 41A, 41B, 42A, 42B, 43A, 43B; 45A, 45B; 51A; 51B; 52; 53A; 53B; 60, 61, 62A, 62B, 63A, 63B) can be disabled.

Example 14. A sampling method, comprising:
in a first operating phase, coupling a first terminal of a capacitor (14A) to a first input signal (s1), and a first terminal of a second capacitor (14B) to a second input signal (s2); and
in a second operating phase, coupling the first terminal of the first capacitor (14A) and the first terminal of the second capacitor (14B) to a common-mode signal (cm), which corresponds to a common-mode component of the first signal (s1) and of the second signal (s2).

Example 15. The sampling method according to Example 14, further comprising sampling the common-mode signal (cm), wherein in the second operating phase, the first terminal of the first capacitor (14A) and the first terminal of the second capacitor (14B) are coupled to the sampled input signal.

Example 16. The sampling method according to Example 14 or 15, further comprising generating the common-mode signal (cm) using a divider circuit (22A, 22B; 41A, 41B, 42A, 42B, 43A, 43B; 62A, 62B; 63A; 63B), to which the first signal (s1) and the second signal (s2) are fed.

Example 17. The sampling method according to any of Examples 14-16, wherein a difference in the signal value of the first input signal and of the second input signal is less than 1/10 of a signal value of the first input signal and of the second input signal.

Although specific exemplary embodiments have been illustrated and described in this description, it will be obvious to a person skilled in the art that a multitude of alternative and/or equivalent implementations can be chosen as a substitute for the specific exemplary embodiments shown and described in this description, without departing from the scope of the disclosed invention. The intention is that this application covers all the adaptations or variations of the specific exemplary embodiments discussed here. It is therefore intended that this invention is limited only by the claims and the equivalents of the claims.

What is claimed is:
1. A sampling circuit, comprising:
a first input, which is configured to receive a first signal;
a second input, which is configured to receive a second signal;
a first sampling capacitor;
a second sampling capacitor;
a common-mode signal generating circuit, which is configured to generate a common-mode signal at a common-mode signal node, wherein
the common-mode signal corresponds to a common-mode component of the first signal and of the second signal,
the common-mode signal generating circuit comprises a divider circuit coupled between the first input and the second input, and
the divider circuit comprises a series circuit coupled between the first input and the second input, and the series circuit comprises a first resistor, a first diode-connected transistor, a second diode-connected transistor and a second resistor; and
a switching circuit, which is configured to couple, in a first operating phase, a first terminal of the first sampling capacitor to the first input, and a first terminal of the second sampling capacitor to the second input, and in a second operating phase, to couple the first terminal of the first sampling capacitor and the first terminal of the second sampling capacitor to the common-mode signal node.

2. The sampling circuit of claim 1, wherein the switching circuit is configured to decouple the first terminal of the first sampling capacitor from the first input, and to decouple the first terminal of the second sampling capacitor from the second input, in the second operating phase.

3. The sampling circuit of claim 1, wherein the divider circuit comprises a third transistor and a fourth transistor, wherein a control terminal of the third transistor is connected to a control terminal of the first diode-connected transistor, and wherein a control terminal of the fourth transistor is connected to a control terminal of the second diode-connected transistor.

4. The sampling circuit of claim 3, further comprising:
a first common-mode sampling switch connected between the control terminal of the first diode-connected transistor and an output node of the first diode-connected transistor;
a second common-mode sampling switch connected between the control terminal of the second diode-connected transistor and the output node of the second diode-connected transistor; and
a third common-mode sampling switch connected between the control terminal of the first diode-connected transistor and the control terminal of the second diode-connected transistor.

5. The sampling circuit of claim 4, further comprising:
a first common-mode sampling capacitor connected to the control terminal of the first diode-connected transistor; and
a second common-mode sampling capacitor connected to the control terminal of the second diode-connected transistor.

6. The sampling circuit of claim 3, wherein:
the first diode-connected transistor comprises an NMOS transistor;
the second diode-connected transistor comprises a PMOS transistor;
the third transistor comprises an NMOS transistor; and
the fourth transistor comprises a PMOS transistor.

7. The sampling circuit of claim 3, wherein:
an output node of the third transistor is connected to the common-mode signal node; and
an output node of the fourth transistor is connected to the common-mode signal node.

8. The sampling circuit of claim 7, wherein the switching circuit comprises:
a first switch coupled between the first input and the first terminal of the first sampling capacitor;
a second switch coupled between the second input and the first terminal of the second sampling capacitor;
a third switch coupled between the first terminal of the first sampling capacitor and the common-mode signal node; and
a fourth switch coupled between the first terminal of the second sampling capacitor and the common-mode signal node.

9. A sampling method, comprising:
in a first operating phase, coupling a first terminal of a first sampling capacitor to a first input signal node, and a first terminal of a second sampling capacitor to a second input signal node;
in a second operating phase, coupling the first terminal of the first sampling capacitor and the first terminal of the second sampling capacitor to a common-mode signal node, wherein the common-mode signal node provides a common-mode signal corresponding to a common-mode component of a first signal at the first input signal node and a second signal at the second input signal node; and
generating the common-mode signal comprising applying the first signal to a first node of a divider circuit, and applying the second signal to a second node of the divider circuit, wherein the divider circuit comprises a first resistor, a first diode-connected transistor, a second diode-connected transistor and a second resistor coupled in series.

10. The sampling method as claimed in claim 9, further comprising sampling the common-mode signal to provide a sampled common-mode signal at the common-mode signal node, wherein in the second operating phase, the sampled common-mode signal is applied to the first terminal of the first sampling capacitor and to the first terminal of the second sampling capacitor.

11. The sampling method of claim 9, where herein a difference in a signal value of the first signal and a signal value of the second signal is less than one-tenth of the signal value of the first signal or the signal value of the second signal.

12. The sampling method of claim 9, further comprising:
buffering a voltage of a gate of the first diode-connected transistor to the common-mode signal node using a first source follower transistor; and
buffering a voltage of a gate of the second diode-connected transistor to the common-mode signal node using a second source follower transistor.

13. The sampling method of claim 12, further comprising;
performing a sample and hold of a voltage at a gate of the first source follower transistor; and
performing a sample and hold of a voltage at a gate of the second source follower transistor.

* * * * *